(12) United States Patent
Simonnet et al.

(10) Patent No.: US 12,009,658 B2
(45) Date of Patent: Jun. 11, 2024

(54) UNIDIRECTIONAL TRANSIENT VOLTAGE SUPPRESSION DEVICE

(71) Applicant: STMicroelectronics (Tours) SAS, Tours (FR)

(72) Inventors: Jean-Michel Simonnet, Veretz (FR); David Jouve, St-Antoine-du-Rocher (FR); Frédéric Lanois, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days.

(21) Appl. No.: 17/661,352

(22) Filed: Apr. 29, 2022

(65) Prior Publication Data
US 2022/0360072 A1 Nov. 10, 2022

(30) Foreign Application Priority Data
May 7, 2021 (FR) .................................. 2104856

(51) Int. Cl.
*H02H 9/04* (2006.01)
*H01L 27/02* (2006.01)
*H02H 9/00* (2006.01)

(52) U.S. Cl.
CPC ......... *H02H 9/046* (2013.01); *H01L 27/0255* (2013.01); *H02H 9/005* (2013.01)

(58) Field of Classification Search
CPC .... H02H 9/046; H02H 9/005; H01L 27/0255; H01L 2224/06181; H01L 2224/73265; H01L 23/60; H01L 25/072; H01L 29/0603; H01L 29/872; H01L 29/8611; H01L 29/0684; H02M 1/346; H02M 1/32; H02M 1/348; H02M 3/003; H02M 3/33573

USPC ......................................................... 361/91.5
See application file for complete search history.

(56) References Cited

U.S. PATENT DOCUMENTS

| | | | | |
|---|---|---|---|---|
| 4,110,775 A * | 8/1978 | Festa | ................... | H01L 29/0619 257/481 |
| 8,767,369 B2 * | 7/2014 | Kuttenkuler | ..... | H03K 17/08128 361/111 |
| 8,785,970 B2 * | 7/2014 | Menard | ............... | H01L 29/1012 257/119 |

(Continued)

FOREIGN PATENT DOCUMENTS

| CN | 103579369 A | | 2/2014 |
|---|---|---|---|
| CN | 103872673 A | * | 6/2014 |

(Continued)

*Primary Examiner* — Dharti H Patel
(74) *Attorney, Agent, or Firm* — Slater Matsil, LLP

(57) ABSTRACT

The present disclosure relates to a transient voltage suppression device comprising a single crystal semiconductor substrate doped with a first conductivity type comprising first and second opposing surfaces, a semiconductor region doped with a second conductivity type opposite to the first conductivity type extending into the substrate from the first surface, a first electrically conductive electrode on the first side contacting the semiconductor region and a second electrically conductive electrode on the second side contacting the substrate, a first interface between the substrate and the semiconductor region forming the junction of a TVS diode and a second interface between the first electrically conductive electrode and the semiconductor region or between the substrate and the second electrically conductive electrode forming the junction of a Schottky diode.

21 Claims, 6 Drawing Sheets

(56) References Cited

U.S. PATENT DOCUMENTS

| | | | | |
|---|---|---|---|---|
| 11,670,940 B2* | 6/2023 | Gutsul | ................... | H01L 23/60 |
| | | | | 361/56 |
| 2002/0125541 A1* | 9/2002 | Korec | ................... | H01L 29/872 |
| | | | | 257/E29.338 |
| 2003/0151877 A1* | 8/2003 | Young | ................ | H01L 27/0251 |
| | | | | 361/212 |
| 2006/0181828 A1* | 8/2006 | Sato | ....................... | H01L 23/62 |
| | | | | 361/91.1 |
| 2008/0013240 A1* | 1/2008 | Kao | ..................... | H01L 29/872 |
| | | | | 361/111 |
| 2014/0268443 A1* | 9/2014 | Nassar | .................. | H02H 3/202 |
| | | | | 361/57 |
| 2018/0269313 A1 | 9/2018 | Bina et al. | | |
| 2023/0207554 A1* | 6/2023 | Mueller | ............. | H01L 27/0248 |
| | | | | 361/56 |

FOREIGN PATENT DOCUMENTS

| | | | |
|---|---|---|---|
| CN | 110718545 A * | 1/2020 | |
| EP | 4086973 A1 * | 11/2022 | ............. H01L 23/60 |

* cited by examiner

UNIDIRECTIONAL TRANSIENT VOLTAGE SUPPRESSION DEVICE

CROSS-REFERENCE TO RELATED APPLICATIONS

This application claims the benefit of French Patent Application No. 2104856, filed on May 7, 2021, which application is hereby incorporated herein by reference.

TECHNICAL FIELD

The present disclosure relates generally to transient voltage suppression devices.

BACKGROUND

A transient voltage suppression device, also referred to as a TVS device, is a device used to protect an electronic component or components from voltage spikes.

One example of a TVS device is a transient voltage suppression diode, also known as a TVS diode. This is a diode made of a semiconductor material that limits surges by an avalanche effect for the sole purpose of protecting an electronic circuit. A TVS diode can be unidirectional, i.e. have a breakdown voltage in reverse bias and a threshold voltage in forward bias. A TVS diode can be bidirectional, i.e. have symmetrical or unsymmetrical breakdown voltages regardless of bias direction.

To protect an electronic component from voltage spikes, the TVS device may be placed in parallel with the component to be protected. It is desirable that the TVS device does not interfere with the normal operation of the electronic component it is protecting. However, where the TVS device is a unidirectional TVS diode, this diode may conduct current when forward biased with sufficient voltage and may then interfere with the normal operation of the electronic component it protects.

SUMMARY

One embodiment addresses all or some of the drawbacks of known transient voltage suppression devices.

One embodiment provides a transient voltage suppression device comprising a single crystal semiconductor substrate doped with a first conductivity type comprising first and second opposing surfaces, a semiconductor region doped with a second conductivity type opposite to the first conductivity type extending into the substrate from the first surface, a first electrically conductive electrode on the first surface contacting the semiconductor region and a second electrically conductive electrode on the second surface contacting the substrate, a first interface between the substrate and the semiconductor region forming the junction of a TVS diode and a second interface between the first electrically conductive electrode and the semiconductor region or between the substrate and the second electrically conductive electrode forming the junction of a Schottky diode.

According to one embodiment, the dopant concentration of the second conductivity type of the semiconductor region is between $1 \cdot 10^{16}$ at/cm$^3$ and $1 \cdot 10^{17}$ at/cm$^3$ when the second interface is located between the first electrically conductive electrode and the semiconductor region, and the dopant concentration of the second conductivity type of the semiconductor region is between $1 \cdot 10^{16}$ at/cm$^3$ and $1 \cdot 10^{20}$ at/cm$^3$ when the second interface is located between the substrate and the second electrically conducting electrode.

According to one embodiment, the dopant concentration of the first conductivity type of the substrate at the first interface is between $2 \cdot 10^{14}$ at/cm$^3$ and $3 \cdot 10^{16}$ at/cm$^3$ when the second interface is located between the first electrically conductive electrode and the semiconductor region, and the dopant concentration of the first conductivity type of the substrate at the first interface is between $2 \cdot 10^{14}$ at/cm$^3$ and $1 \cdot 10^{17}$ at/cm$^3$ when the second interface is located between the substrate and the second electrically conductive electrode.

According to one embodiment, the substrate comprises a stack of first and second portions, the first portion containing the semiconductor region and the second portion being in contact with the second electrically conductive electrode, the dopant concentration of the first conductivity type of the first portion being strictly lower than the dopant concentration of the first conductivity type of the second portion.

One embodiment provides an electronic circuit comprising an electrically conductive substrate, an electronic component having first and second terminals, the second terminal being attached to the electrically conductive substrate, and the transient voltage suppression device as previously defined, with the second electrically conductive electrode of the transient voltage suppression device being attached to the substrate.

According to one embodiment, the first electrically conductive electrode of the transient voltage suppression device is connected to the first terminal of the electronic component.

One embodiment provides an electronic circuit comprising at least one electronic component and a transient voltage suppression device, as defined above, arranged in parallel with the electronic component.

According to one embodiment, the circuit comprises at least four electronic components connected in a bridge configuration and four transient voltage suppression devices, with each transient voltage suppression device being arranged in parallel with one of the electronic components.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various Figures. In particular, the structural and/or functional features that are common among the various embodiments may have the same references and may dispose identical structural, dimensional and material properties. For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements. In addition, "insulator" and "conductor" herein are understood to mean "electrically insulating" and "electrically conducting", respectively.

In the following disclosure, unless indicated otherwise, when reference is made to absolute positional qualifiers, such as the terms "top", "bottom", etc., or to relative positional qualifiers, such as the terms "higher", "lower", etc., reference is made to the orientation shown of the Figures or to an electronic device as orientated during normal use. Unless specified otherwise, the expressions "around", "approximately", "substantially" and "in the order of" signify within 10%, and preferably within 5%.

Figure 1:
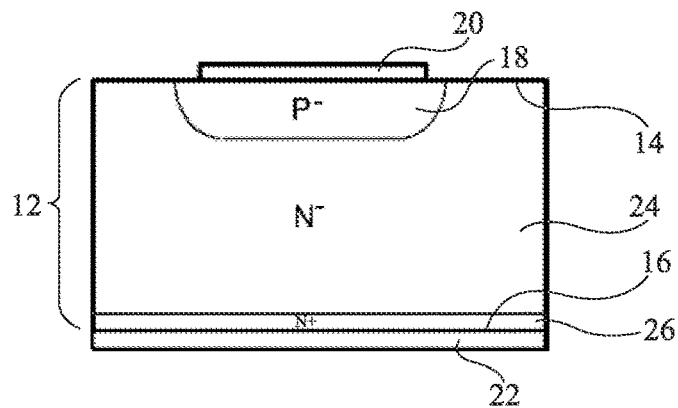
FIG. 1 is a schematic partial cross-sectional view of one embodiment of a TVS device.
Figure 2:
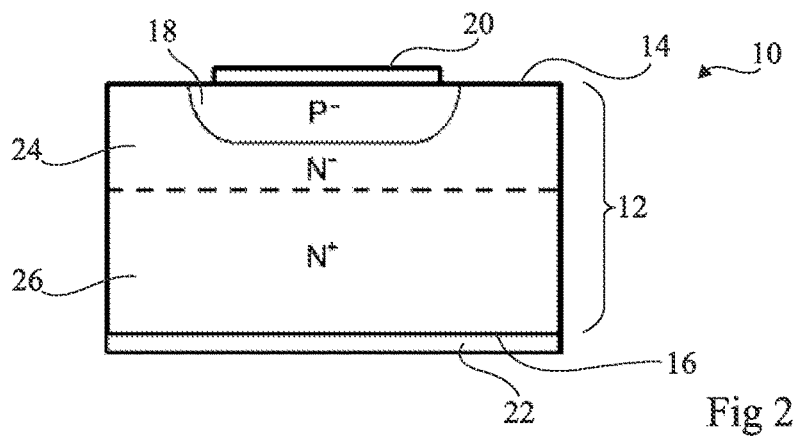
FIG. 2 is a partial schematic cross-sectional view of a variant of the TVS device of FIG. 1.
Figure 3:
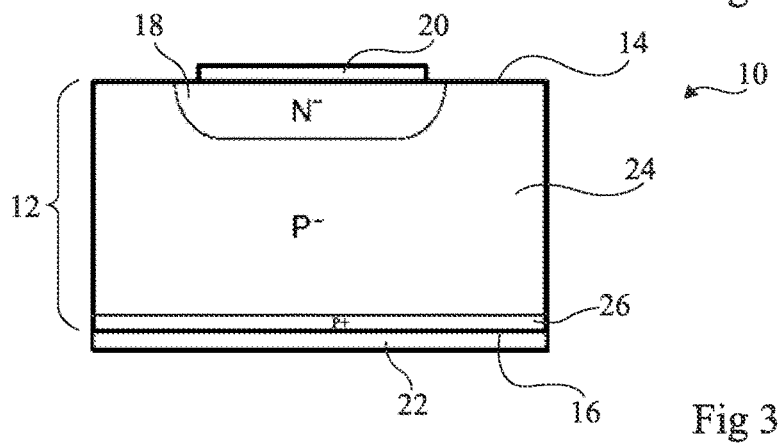
FIG. 3 is a partial schematic cross-sectional view of another variant of the TVS device of FIG. 1.
Figure 4:
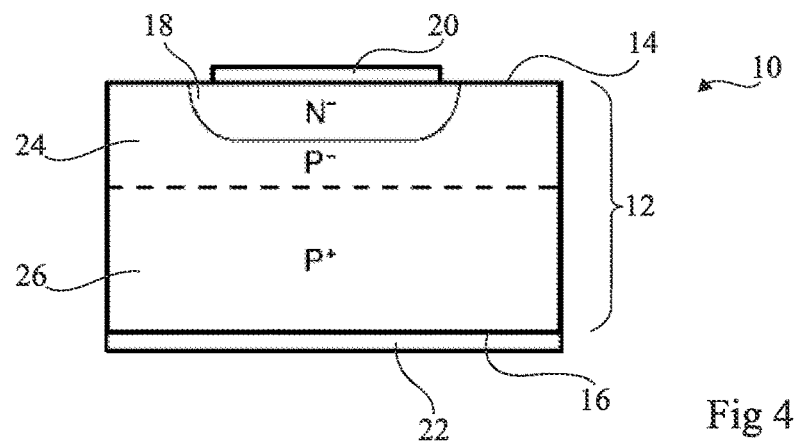
FIG. 4 is a partial schematic cross-sectional view of another variant of the TVS device of FIG. 1.

FIG. 1 is a schematic partial cross-sectional view of one embodiment of a TVS device 10. FIGS. 2, 3, and 4 are partial schematic cross-sectional views of variant embodiments of the TVS device 10.

In FIGS. 1 through 4, the TVS device 10 comprises a semiconductor substrate 12, preferably a single-crystal silicon substrate doped with a first conductivity type having an upper surface 14 and a lower surface 16, dividing into an upper portion 24, lightly doped with the first conductivity type on the upper surface 14, and a lower portion 26, heavily doped with the first conductivity type on the lower surface 16. The device also comprises a lightly doped region 18 of a second conductivity type, opposite to the first conductivity type, extending into the upper portion 24 of the substrate 12 from the upper surface 14, an upper electrode 20, metallic, for example, resting on the upper surface 14 in contact with the region 18, and a lower electrode 22, metallic, for example, resting on the lower surface 16 in contact with the substrate 12.

According to one embodiment, the surfaces 14 and 16 are planar. According to one embodiment, the surfaces 14 and 16 are parallel. According to one embodiment, the thickness of the substrate 12, i.e. the distance between the surfaces 14 and 16, is between 60 µm and 300 µm, preferably between 90 µm and 300 µm, more preferably between 150 µm and 300 µm. The region 18 may be formed by a step of implanting dopants of the second conductivity type into the substrate 12.

For the TVS device 10 of FIGS. 1 and 3, the lightly doped upper portion 24 of the first conductivity type forms the bulk of the substrate 12, with the lower portion 26 having a thickness of less than 5% of the total thickness of the substrate 12, for example. The heavily doped lower portion 26 of the first conductivity type may be formed by a step of implanting dopants of the first conductivity type on the side of the lower surface 16. The dopant concentration of the first conductivity type in the substrate 12 outside of the region 18 and the lower portion 26 is substantially constant. For the TVS device 10 of FIGS. 2 and 4, the thickness of the heavily doped lower portion 26 of the first conductivity type is greater than 10% of the total thickness of the substrate 12. According to one embodiment, the upper portion 24 of the substrate 12 is epitaxially formed on the lower portion 26 of the substrate 12.

For the TVS device 10 of FIGS. 1 and 2, the first conductivity type is N-type and the second conductivity type is P-type. The concentration of P-type dopants in the region 18 is between $1 \cdot 10^{16}$ at/cm$^3$ and $1 \cdot 10^{17}$ at/cm$^3$. According to one embodiment, the maximum thickness of region 18 is between 1 µm and 40 µm. The concentration of N-type dopants in the upper portion 24 of the substrate 12 outside of the region 18 is between $2 \cdot 10^{14}$ at/cm$^3$ and $3 \cdot 10^{16}$ at/cm$^3$. The dopant concentration in the lower, heavily N-doped portion 26 of the substrate 12 is between $8 \cdot 10^{18}$ at/cm$^3$ and $8 \cdot 10^{19}$ at/cm$^3$. For the variant shown in FIG. 2, the thickness of the upper portion 24 of the substrate 12, measured from the upper surface 14, is between 5 µm and 100 µm.

For the TVS device 10 of FIGS. 3 and 4, the first conductivity type is P-type and the second conductivity type is N-type. The N-type dopant concentration of region 18 is between $1 \cdot 10^{16}$ at/cm$^3$ and $1 \cdot 10^{17}$ at/cm$^3$. According to one embodiment, the maximum thickness of region 18 is between 1 µm and 40 µm. The concentration of P-type dopants in the upper portion 24 of the substrate 12 outside of the region 18 is between $2 \cdot 10^{14}$ at/cm$^3$ and $3 \cdot 10^{16}$ at/cm$^3$. The dopant concentration in the lower heavily P-doped portion 26 of the substrate 12 is between $8 \cdot 10^{18}$ at/cm$^3$ and $8 \cdot 10^{19}$ at/cm$^3$. For the embodiment shown in FIG. 4, the thickness of the upper portion 24 of the substrate 12, measured from the upper surface 14 is between 5 µm and 100 µm.

The TVS device 10 shown in FIGS. 1 through 4 behaves as anti-serial between two terminals of a TVS diode and a Schottky diode integrated in a single semiconductor substrate. The terminals correspond to the electrodes 20 and 22. The interface between the electrode 20 and the lightly doped region 18 of the second conductivity type forms the junction of the Schottky diode. The junction between the low-doped region 18 of the second conductivity type and the adjacent low-doped portion of the substrate 12 of the first conductivity type forms the TVS diode junction. The lower electrode 22 forms an ohmic contact with the substrate 12.

Figure 5:
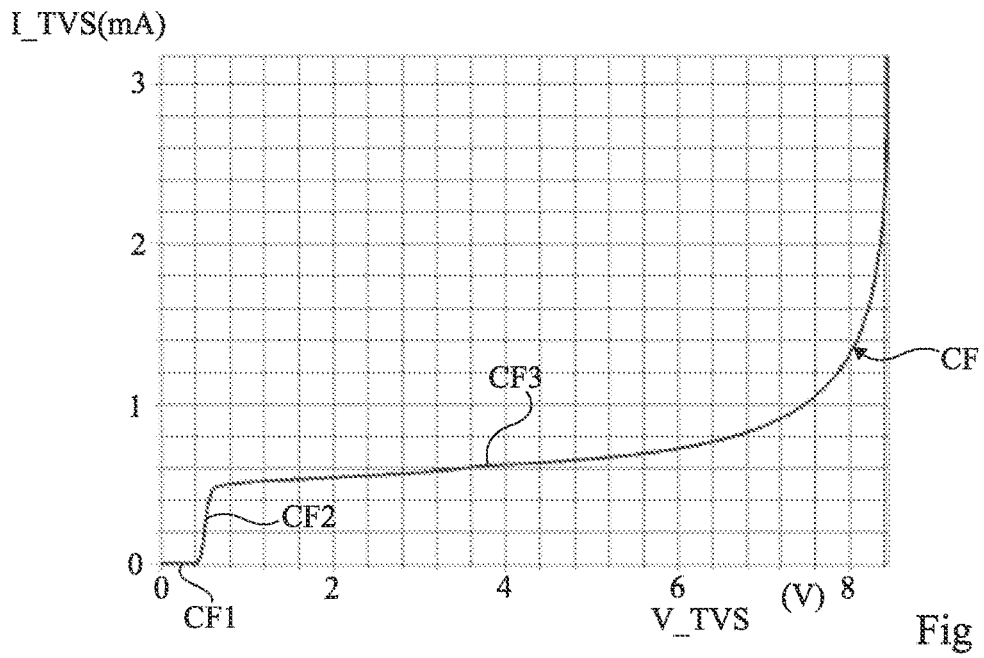
FIG. 5 shows an evolution curve of the current flowing in the TVS device of FIG. 1 depending on the voltage applied to the TVS device according to a first polarization direction.

FIG. 5 shows a CF curve of the evolution of the current I_TVS flowing from electrode 20 to electrode 22 of the TVS device 10 of FIG. 2 depending on the voltage V_TVS between the electrode 20 and the electrode 22. For the simulations, the thickness of the upper portion 24 of the substrate 12 was 18 μm and the thickness of the lower portion 26 of the substrate 12 was 10 μm. The CF curve was obtained by simulation with a maximum P-type dopant concentration (exhibiting a Gaussian profile) of the region 18 equal to $3 \cdot 7 \cdot 10^{16}$ cm$^3$, an N-type dopant concentration of the upper portion 24 of the substrate 12 equal to $9 \cdot 10^{14}$ cm$^3$ and an N-type dopant concentration of the lower portion 26 of the substrate 12 equal to $2 \cdot 10^{19}$ cm$^3$.

This corresponds to a forward bias of the TVS diode of the TVS device 10 and a reverse bias of the Schottky diode of the TVS device 10. The CF curve successively comprises a part CF1, for which the current I_TVS is substantially zero, a part CF2, for which the current I_TVS increases rapidly with the voltage V_TVS when the forward-biased TVS diode of the TVS device 10 becomes conductive and the saturation current of the Schottky diode has not been reached, and a portion CF3, for which the current I_TVS substantially corresponds to the reverse leakage current of the Schottky diode of the TVS device 10 and increases with the voltage applied across the reverse-biased Schottky diode of the TVS device 10. Preferably, the voltages applied to the TVS device 10 corresponding to reverse biased Schottky diode of the TVS device 10 are less than the reverse breakdown voltage of the Schottky diode, which may be in the range of 1 V to 20 V, depending on the doping and thickness of the region 18.

Figure 6:
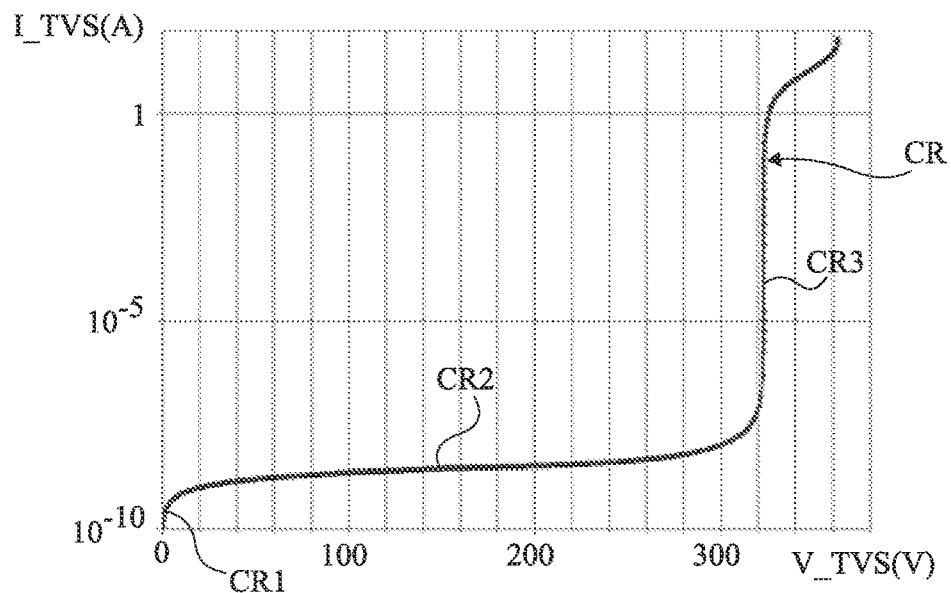
FIG. 6 shows an evolution curve of the current flowing in the TVS device of FIG. 1 depending on the voltage applied to the TVS device according to a second polarization direction.

FIG. 6 shows a CR curve of the evolution of the current I_TVS flowing from the electrode 22 to the electrode 20 of the TVS device 10 of FIG. 1 depending on the voltage V_TVS between the electrode 22 and the electrode 20. The CR curve was obtained by simulation with the same dopant concentrations as the CF curve.

This corresponds to a reverse bias of the TVS diode of the TVS device 10 and a forward bias of the Schottky diode of the TVS device 10. The CR curve successively comprises a part CR1, for which the current I_TVS increases rapidly with the voltage V_TVS, this and a part CR2, for which the current I_TVS increases more slowly with the voltage V_TVS, and a part CR3, for which the current I_TVS increases very rapidly with the voltage V_TVS. The parts CR1 and CR2 correspond to an increase in the current leakage of the diode TVS due to the enlargement of the space charge region. The difference in increase in current between the parts CR1 and CR2 is due to the enlargement of the space charge area. The part CR3 corresponds to the avalanche operation of the TVS diode in the TVS device 10. Since the saturation current Isat_Sch of the Schottky diode is much higher than the leakage current I_TVS of the TVS diode, the Schottky diode has a very low voltage across these terminals that does not affect the electrical characteristic of the TVS diode before it goes into the avalanche operation. The voltage V_Schottky on the Schottky diode can be written as the following relationship:

$$V\_Schottky = (kT/q) * \ln(I\_TVS/Isat\_Sch + 1) \quad (1)$$

where k is the Boltzmann constant, T the absolute temperature, and q the electric charge of the electron.

For I_TVS much lower than Isat_Sch, the voltage V_Schottky is approximately equal to kT/q*I_TVS/Isat_Sch which is a few millivolts, at most, and is therefore negligible as compared to the voltage across the TVS diode. As a result, the voltage V_TVS across the TVS device 10, which is equal to the sum of the voltage V_Schottky across the Schottky diode and the voltage across the TVS diode, is approximately equal to the voltage across the TVS diode. When the current becomes higher than Isat_Sch, the Schottky diode voltage increases by approximately 60 mV per decade of current, which is added to the TVS diode voltage. This voltage corresponds to the Schottky diode threshold voltage and is generally lower than 1 V. In most cases, this voltage will be negligible as compared to the avalanche voltage of the TVS diode. The presence of the Schottky diode therefore affects the TVS diode characteristic very little.

The variants of the TVS device 10 shown in FIGS. 2 and 4 advantageously allow for a reduction in the series resistance of the TVS device 10 between the terminals 20 and 22 due to the heavily doped lower portion 26 of the substrate 12 having a reduced resistivity. These variants can thus have an increased power dissipation capability. Dissipating less power for a given pulse, these variants will be able to withstand higher current overloads.

Figure 7:
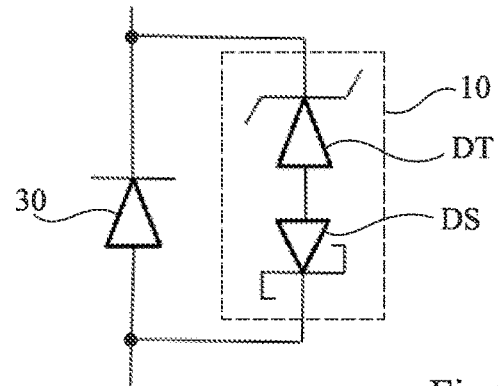
FIG. 7 is an electrical diagram illustrating an example of the TVS device assembly for protecting an electronic component.

FIG. 7 is a schematic diagram illustrating an example of a TVS device 10 arrangement for protecting an electronic component 30, a diode in FIG. 7. Generally, the electronic component 30 to be protected is a diode such as a Schottky diode, a silicon carbide (SiC) diode, a power MOS transistor with an intrinsic diode, or an insulated gate bipolar transistor (IGBT) with an external diode in antiparallel. According to one embodiment, the TVS device 10 is placed in parallel with the electronic component 30 to be protected. The TVS device 10 is shown schematically in FIG. 7 by a TVS diode DT in anti-series with a Schottky diode DS. The TVS device 10 is oriented so that the TVS diode DT of the TVS device 10 is forward biased when the electronic component 30 conducts a current of maximum intensity during normal operation. Where the electronic component 30 is a diode, the TVS device 10 is oriented so that the TVS diode DT of the TVS device 10 is forward biased when the electronic component 30 is forward biased.

As a result, when the electronic component 30 conducts a maximum intensity current during normal operation, the Schottky diode of the TVS device 10 blocks the flow of current through the TVS device 10 so that the TVS device 10 does not interfere with the normal operation of the component 30. In the event that a reverse voltage spike occurs, the TVS diode in the TVS device 10 clips the voltage and thereby protects the component 30.

Figure 8:
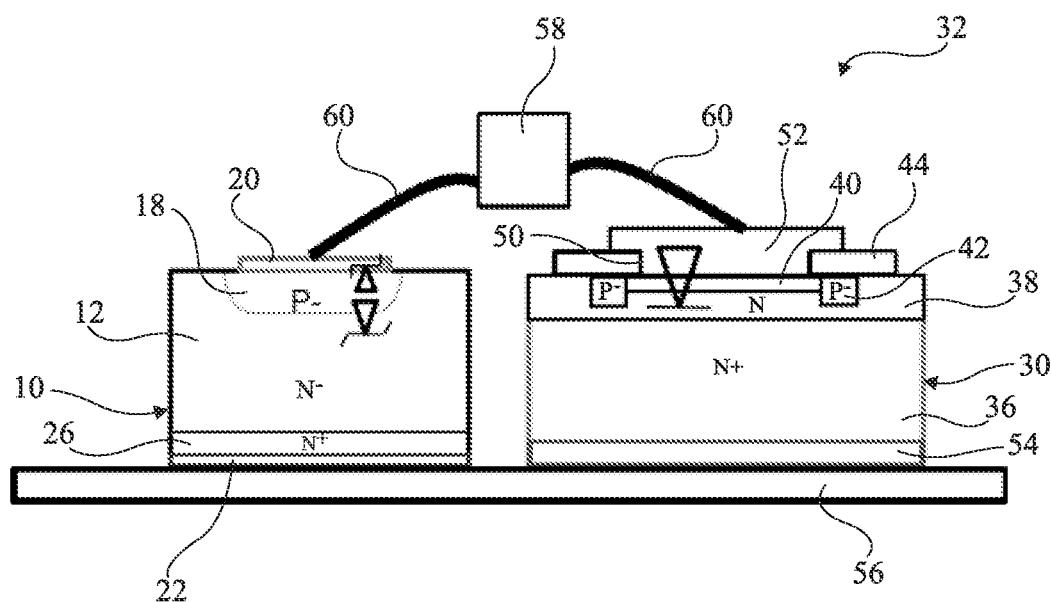
FIG. 8 is a partial schematic cross-sectional view of an electronic circuit according to the electrical diagram of FIG. 7.

FIG. 8 is a partial, schematic sectional view of one embodiment integrated in a single package of an electronic circuit 32 corresponding to the circuit diagram of FIG. 7, and comprising the TVS device 10 connected in parallel with the electronic component 30 corresponding to a diode. As an example, the diode 30 comprises a semiconductor substrate 36, such as an N-doped single crystal silicon substrate, an N-doped silicon layer 38 epitaxially formed on the substrate 36, a P-doped region 40 formed in the layer 38, an annular region 42 formed in the layer 38 and surrounding the P-doped region 40 and more lightly doped than the region 40, an insulating layer 44 overlying the annular region 42 and defining an opening 50 exposing a portion of the region 40, an electrically conductive electrode 52 contacting the region 40 in the opening 50, and a metallic electrode 54 on the side of the substrate 36 opposite the layer 38.

The circuit 32 further comprises a conductive support 56 to which the TVS device 10 and the diode 30 are attached, with the lower electrode 22 of the TVS device 10 attached to the support 56, and the electrode 54 of the diode 30 attached to the support 56. The bracket 56 forms a common cathode for the diode 30 and the TVS diode of the TVS device 10. The circuit 32 further comprises a conductive pad 58, shown schematically for illustrative purposes by a square above the TVS device 10 and the diode 30, connected to the upper electrode 20 of the TVS device 10 and the electrode 52 of the diode 30, by wires 60, for example.

The electronic circuit 32 thus integrates the TVS device 10 and the electronic component 30 to be protected on the same support 56. This reduces parasitic inductances between the TVS device 10 and the electronic component 30, thereby improving the protection of the electronic component 30.

In addition, the use of the TVS device 10 incorporating a TVS diode and a Schottky diode is simpler than protecting with a TVS diode and a Schottky diode as discrete components.

Figure 9:
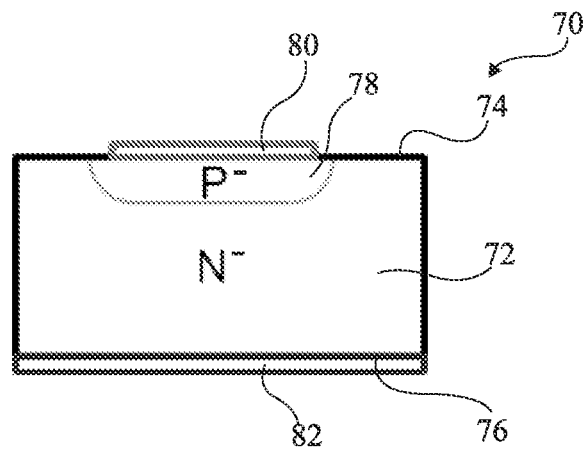
FIG. 9 is a partial schematic cross-sectional view of another embodiment of a TVS device.
Figure 10:
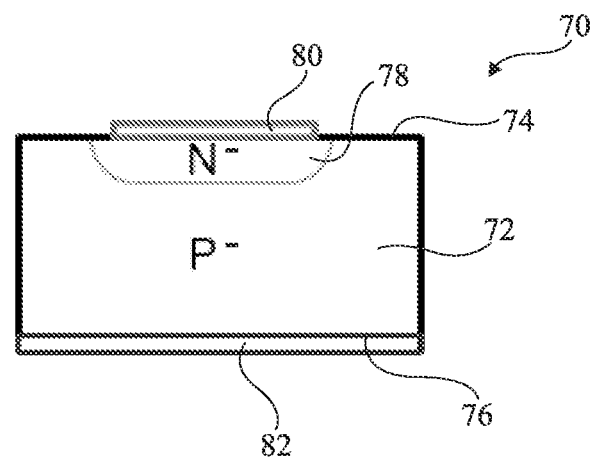
FIG. 10 is a partial schematic cross-sectional view of a variant embodiment of the TVS device of FIG. 9.

FIG. 9 is a partial, schematic sectional view of another embodiment of a TVS device 70. FIG. 10 is a partial, schematic sectional view of a variant of a TVS device 70.

In FIGS. 9 and 10, the TVS device 70 comprises a semiconductor substrate 72, preferably a lightly doped single crystal silicon substrate of a first conductivity type, having an upper surface 74 and a lower surface 76, a region 78 doped with a second conductivity type, opposite to the first conductivity type, extending into the substrate 72 from the upper surface 74 through a portion of the thickness of the substrate 72, an electrically conductive upper electrode 80, metallic, for example, resting on the upper surface 74 in contact with the region 78, and an electrically conductive lower electrode 82, metallic, for example, resting on the lower surface 76 in contact with the substrate 72.

According to one embodiment, the surfaces 74 and 76 are planar. According to one embodiment, the surfaces 74 and 76 are parallel. According to one embodiment, the thickness of the substrate 72, i.e. the distance between the surfaces 74 and 76, is between 60 µm and 300 µm, preferably between 90 µm and 300 µm, more preferably between 150 µm and 300 µm. The region 78 may be formed by a step of implanting dopants of the second conductivity type into the substrate 72.

For the device 70 of FIGS. 9 and 10, the dopant concentration of the first conductivity type in the substrate 72 outside of the region 78 is substantially constant.

For the device 70 of FIG. 9, the first conductivity type is N-type and the second conductivity type is P-type. The P-type dopant concentration of region 78 is between $1 \cdot 10^{16}$ at/cm$^3$ and $1 \cdot 10^{20}$ at/cm$^3$. According to one embodiment, the maximum thickness of region 78 is between 1 µm and 40 µm. The concentration of N-type dopants in the substrate 72 outside of the region 78 is between $2 \cdot 10^{14}$ at/cm$^3$ and $1 \cdot 10^{17}$ at/cm$^3$.

For the device 70 in FIG. 10, the first conductivity type is P-type and the second conductivity type is N-type. The N-type dopant concentration of region 78 is between $1 \cdot 10^{16}$ at/cm$^3$ and $1 \cdot 10^{20}$ at/cm$^3$. According to one embodiment, the maximum thickness of the region 78 is between 1 µm and 40 µm. The concentration of P-type dopants in the substrate 72 outside of the region 78 is between $2 \cdot 10^{14}$ at/cm$^3$ and $1 \cdot 10^{17}$ at/cm$^3$.

The device 70 shown in FIGS. 9 and 10 behaves as anti-serial between two terminals of a TVS diode and a Schottky diode. The terminals correspond to the electrodes 80 and 82. The interface between the electrode 82 and the lightly doped substrate 72 of the first conductivity type forms the junction of the Schottky diode. The junction between the doped region 78 of the second conductivity type and the adjacent lightly doped portion of the substrate 72 of the first conductivity type forms the TVS diode junction. The upper electrode 80 forms an ohmic contact with the region 78.

Figure 11:
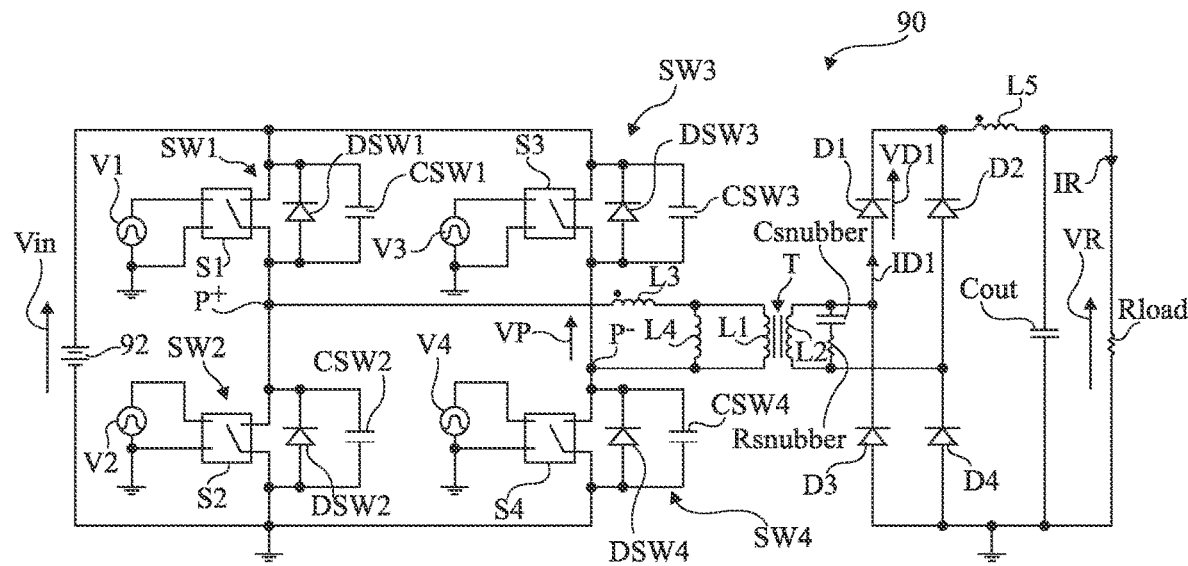
FIG. 11 is a schematic diagram of an example of a DC-DC voltage converter.

The TVS device 10 or 70 may be used in any electronic circuit comprising an electronic component that needs to be protected from voltage spikes. The electronic circuit is, a DC to DC, AC to DC or DC to AC converter operating under so-called hard switching conditions with high current levels, for example:

FIG. 11 is a circuit diagram of an example of a DC-to-DC voltage converter 90. The converter 90 comprises a source 92 of a DC voltage Vin, and first, second, third, and fourth switch blocks SW1, SW2, SW3, SW4, each switch block SW1, SW2, SW3, SW4 comprising a switch S1, S2, S3, S4, a diode DSW1, DSW2, DSW3, DSW4 connected in parallel with the switch, and a capacitor CSW1, CSW2, CSW3, CSW4 connected in parallel with the switch, with each switch S1, S2, S3, S4 being controlled by means of an isolated coupler of optical technology, each switch S1, S2, S3, S4 being controlled by means of an isolated coupler using optical, magnetic or capacitive technology, by a source V1, V2, V3, V4 of a square-wave control voltage, the first and second switch blocks SW1 and SW2 being connected in series between the positive and negative terminals of the voltage source 92, and the third and fourth switch blocks SW3 and SW4 being connected in series between the positive and negative terminals of the voltage source 92. The device also comprises a transformer T comprising a primary winding L1 and a secondary winding L2, an inductance L3 connecting the midpoint P+ between the first and second switch blocks SW1 and SW2 and a first terminal of the primary winding L1, with the second terminal of the primary winding L1 being connected to the midpoint P− between the third and fourth switch blocks SW3 and SW4, an inductor L4 in parallel between the first and second terminals of the primary winding L1, a diode bridge rectifier circuit connected to the secondary winding L2, comprising a diode D1 whose anode is connected to a first terminal of the secondary winding L2, a diode D2 whose anode is connected to a second terminal of the secondary winding L2, a diode D3 whose cathode is connected to the first terminal of the secondary winding L2, and a diode D4 whose cathode is connected to the second terminal of the secondary winding L2. The device further comprises a capacitor Csnubber in series with a resistor Rsnubber between the first and second terminals of the secondary winding L2, an inductor L5, a first terminal of which is connected to the cathode of the diodes D1 and D2, a capacitor Cout, one electrode of which is connected to the second terminal of the inductor L5 and the second electrode of which is connected to the anode of the diodes D3 and D4, and a load Rload in parallel with the capacitor Cout.

The voltage between the midpoint P+ between the first and second switch blocks SW1 and SW2 and the midpoint P− between the third and fourth switch blocks SW3 and SW4 is referred to as VP, the voltage between the cathode and anode of diode D1 is referred to as VD1, the voltage across resistor Rload is referred to as VR, the current flowing from the anode to the cathode of the diode D1 is referred to as ID1, and the current flowing through the resistor Rload is referred to as IR.

The capacitor Csnubber and the resistor Rsnubber form a transient overvoltage protection device. However, for the electronic circuit 90 shown in FIG. 11, the diodes D1, D2, D3, and D4 are not individually protected by dedicated TVS devices.

Figure 12:
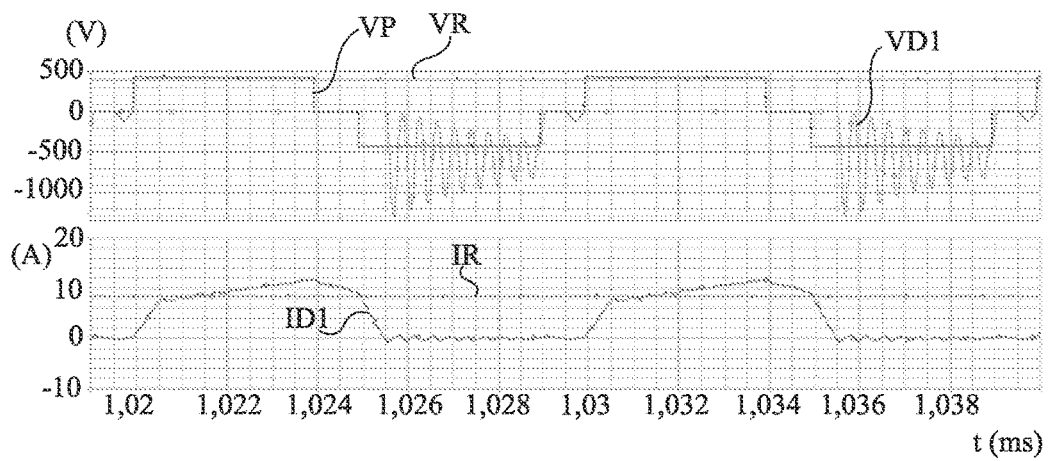
FIG. 12 shows voltage and current timelines of the converter of FIG. 11.

FIG. 12 shows timelines of the voltages VP, VD1, and VR, and the currents ID1 and IR obtained by simulation during operation of the converter 90 of FIG. 11. For this simulation, the voltage Vin is constant and equal to 430 V. The switches S1, S2, S3, and S4 are closed successively with a defined time offset and timing to allow for soft switching at zero voltage of the switches S1, S2, S3, and S4. In the example shown in FIG. 12, over a switching period of 10 μs, each switch S1, S2, S3 and S4 remains closed for 5 μs and then open for 5 μs. The output voltage VR is substantially constant and equal to 360 V. The voltage VP varies substantially in steps, following the sequence of closures and openings of the switches S1, S3, S2, and S4. When the voltage VP reverses from +430 V to −430 V (linked to the switching of the switches S1, S2, S3 and S4), the current Id1 flowing through diode D1 will decrease with a relatively high speed, which is defined by the inductance L3 and the transformation ratio of the transformer T. When the current Id1 reaches zero, the diode D1 will open, causing a significant negative overvoltage and parasitic oscillations of the voltage VD1 from the value of 0 V with a maximum amplitude of 1350 V, which may be higher than the maximum acceptable reverse voltage of the diode D1.

Figure 13:
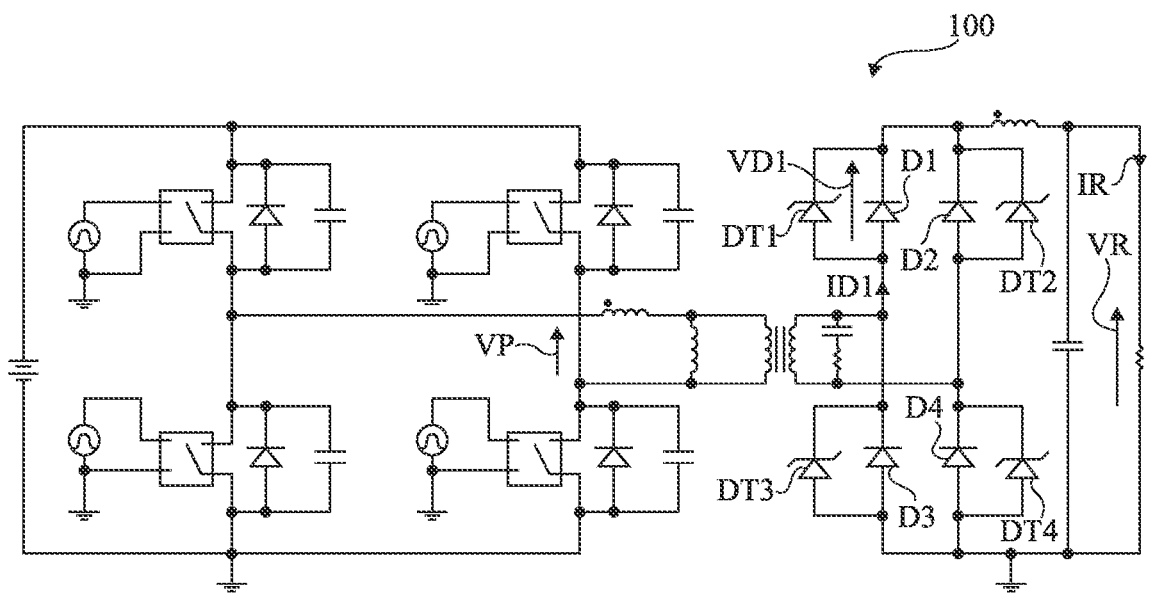
FIG. 13 is a circuit diagram of an example of a DC-to-DC voltage converter with components protected by TVS diodes.

FIG. 13 is a circuit diagram of a DC-DC voltage converter 100. The converter 100 comprises all of the elements of the converter 90 of FIG. 11 and further comprises, for each diode Di, with i being an integer ranging from 1 to 4, a TVS diode DTi in parallel with the diode Di, the anode of the TVS diode DTi being connected to the anode of the diode Di and the cathode of the TVS diode DTi being connected to the cathode of the diode Di.

Figure 14:
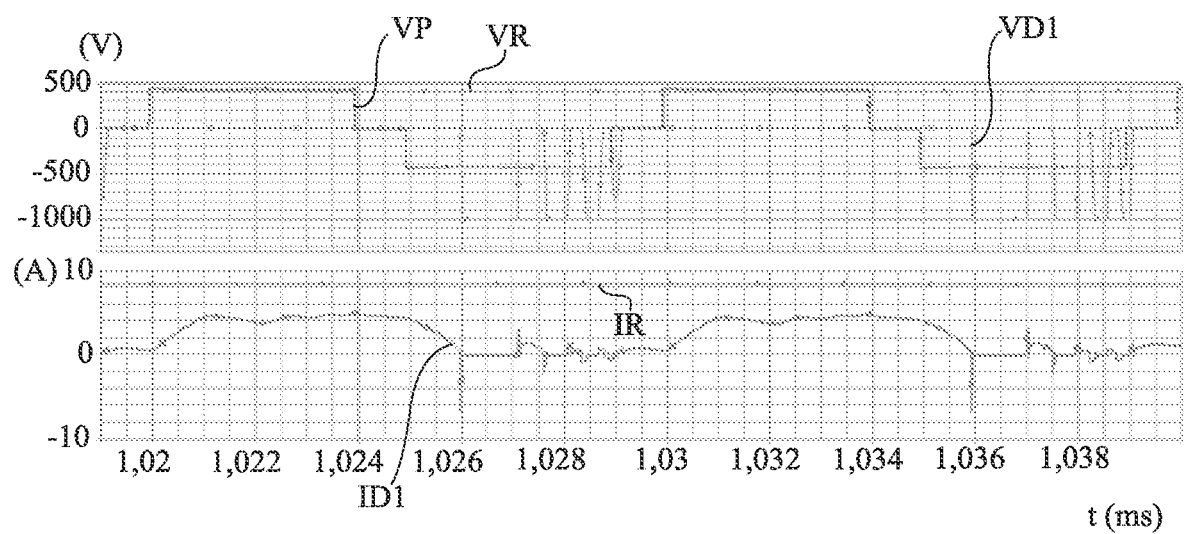
FIG. 14 shows voltage and current timelines of the converter of FIG. 13.

FIG. 14 shows timelines of the voltages VP, VD1, and VR, and currents ID1 and IR obtained by simulation during operation of the converter 100 of FIG. 13. The operating conditions are the same as those used to obtain the timelines in FIG. 12. The parasitic oscillations of the voltage VD1 are clipped by the TVS diode DT1. However, there are significant differences between the curves of the voltage VD1 and the current IR of FIG. 14 and the curves of the voltage VD1 and the current IR of FIG. 12 due to the fact that the current flows in each TVS diode DT1, DT2, DT3, DT4 when it is forward biased and that carrier recombination phenomena can occur.

Figure 15:
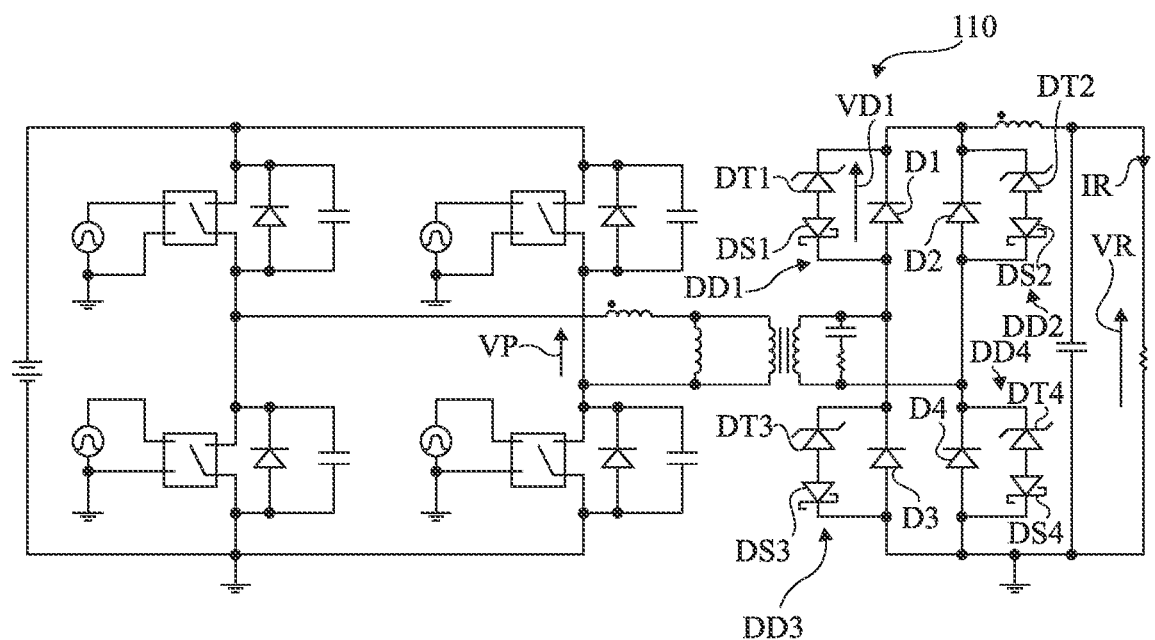
FIG. 15 is a circuit diagram of an example of a DC-to-DC voltage converter having components protected by TVS devices as shown in FIG. 1 and described.

FIG. 15 is an electrical diagram of a DC-DC voltage converter no. The converter no comprises all the elements of the converter 90 of FIG. 11 and further comprises, for each diode Di, i being an integer varying from 1 to 4, a TVS device DDi having the structure of the TVS device 10 shown in FIG. 1, in parallel with the diode Di. Each TVS device DDi is shown in FIG. 15 by the anti-serialization of a TVS diode DTi and a Schottky diode DSi, the cathode of the Schottky diode DSi being connected to the anode of the diode Di and the cathode of the TVS diode DTi being connected to the cathode of the diode Di.

Figure 16:
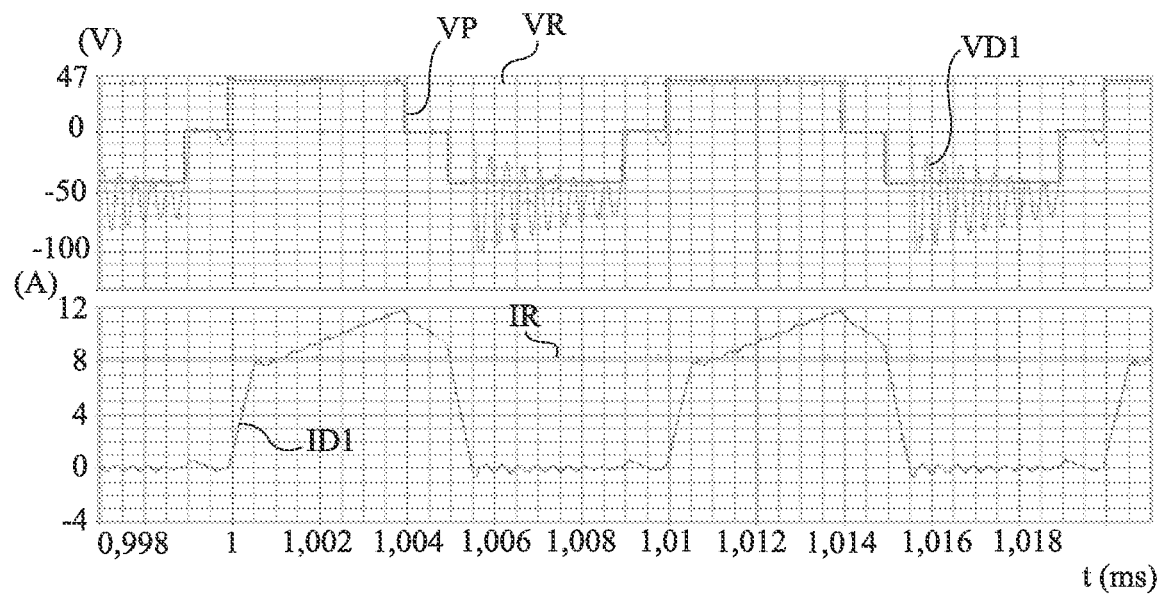
FIG. 16 shows voltage and current timelines of the converter of FIG. 15.

FIG. 16 shows timelines of the voltages VP, VD1, and VR, and currents ID1 and IR obtained by simulation during operation of the converter 110 of FIG. 15. The operating conditions are the same as those used to obtain the timelines in FIG. 12. The parasitic oscillations of the voltage VD1 are clipped. Moreover, the evolution curves of the voltage VD1 and of the current IR of FIG. 16 have the same general shape as the curves of evolution of the voltage VD1 and of the current IR of FIG. 12, which means that the operation of the diodes D1, D2, D3, and D4 is not disturbed by the TVS devices DDi.

Various embodiments and variants have been described. Those skilled in the art will understand that certain features of these embodiments can be combined and other variants will readily occur to those skilled in the art. Finally, the practical implementation of the described embodiments and variants is within the ability of the person skilled in the art from the functional indications given above.

What is claimed is:

1. A transient voltage suppression device comprising:
   a single crystal semiconductor substrate doped with a first conductivity type and comprising first and second surfaces opposing each other;
   a semiconductor region doped with a second conductivity type opposite to the first conductivity type and extending into the substrate from the first surface;
   a first electrically conductive electrode on the first surface contacting the semiconductor region;
   a second electrically conductive electrode on the second surface contacting the substrate;
   a first interface between the substrate and the semiconductor region forming a junction of a transient voltage suppression diode; and
   a second interface between the first electrically conductive electrode and the semiconductor region forming a junction of a Schottky diode.

2. The device according to claim 1, wherein a dopant concentration of the second conductivity type of the semiconductor region is between $1 \cdot 10^{16}$ at/cm$^3$ and $1 \cdot 10^{17}$ at/cm$^3$.

3. The device according to claim 1, wherein a dopant concentration of the first conductivity type of the substrate at the first interface is between $2 \cdot 10^{14}$ at/cm$^3$ and $3 \cdot 10^{16}$ at/cm$^3$.

4. The device according to claim 1, wherein the substrate comprises a stack of first and second portions, wherein:
   the first portion contains the semiconductor region;
   the second portion is in contact with the second electrically conductive electrode; and
   a first dopant concentration of the first conductivity type of the first portion is strictly lower than a second dopant concentration of the first conductivity type of the second portion.

5. An electronic circuit comprising:
   an electrically conductive support;
   an electronic component having first and second terminals, wherein the second terminal is attached to the electrically conductive support; and
   a transient voltage suppression device comprising:
      a single crystal semiconductor substrate doped with a first conductivity type and comprising first and second surfaces opposing each other;
      a semiconductor region doped with a second conductivity type opposite to the first conductivity type and extending into the substrate from the first surface;
      a first electrically conductive electrode on the first surface contacting the semiconductor region;
      a second electrically conductive electrode on the second surface contacting the substrate and attached to the electrically conductive support;
      a first interface between the substrate and the semiconductor region forming a junction of a transient voltage suppression diode; and
      a second interface between the first electrically conductive electrode and the semiconductor region or between the substrate and the second electrically conductive electrode forming a junction of a Schottky diode, the transient voltage suppression diode and the Schottky diode being coupled between the first and the second electrically conductive electrodes in anti-series configuration.

6. The electronic circuit according to claim 5, wherein the first electrically conductive electrode of the transient voltage suppression device is electrically connected to the first terminal of the electronic component.

7. The electronic circuit according to claim 5, wherein the second interface is located between the first electrically conductive electrode and the semiconductor region, and wherein a dopant concentration of the second conductivity type of the semiconductor region is between $1 \cdot 10^{16}$ at/cm$^3$ and $1 \cdot 10^{17}$ at/cm$^3$.

8. The electronic circuit according to claim 5, wherein the second interface is located between the substrate and the second electrically conductive electrode, and wherein a dopant concentration of the second conductivity type of the semiconductor region is between $1 \cdot 10^{16}$ at/cm$^3$ and $1 \cdot 10^{20}$ at/cm$^3$.

9. The electronic circuit according to claim 5, wherein the second interface is located between the first electrically conductive electrode and the semiconductor region, and wherein a dopant concentration of the first conductivity type of the substrate at the first interface is between $2 \cdot 10^{14}$ at/cm$^3$ and $3 \cdot 10^{16}$ at/cm$^3$.

10. The electronic circuit according to claim 5, wherein the second interface is located between the substrate and the second electrically conductive electrode, and wherein a dopant concentration of the first conductivity type of the substrate at the first interface is between $2 \cdot 10^{14}$ at/cm$^3$ and $1 \cdot 10^{17}$ at/cm$^3$.

11. The electronic circuit according to claim 5, wherein the substrate comprises a stack of first and second portions, wherein:
   the first portion contains the semiconductor region;
   the second portion is in contact with the second electrically conductive electrode; and
   a first dopant concentration of the first conductivity type of the first portion is strictly lower than a second dopant concentration of the first conductivity type of the second portion.

12. An electronic circuit comprising:
   at least one electronic component; and
   a transient voltage suppression device arranged in parallel with the electronic component and comprising:
      a single crystal semiconductor substrate doped with a first conductivity type and comprising first and second surfaces opposing each other;
      a semiconductor region doped with a second conductivity type opposite to the first conductivity type and extending into the substrate from the first surface;
      a first electrically conductive electrode on the first surface contacting the semiconductor region;
      a second electrically conductive electrode on the second surface contacting the substrate;
      a first interface between the substrate and the semiconductor region forming a junction of a transient voltage suppression diode; and
      a second interface between the first electrically conductive electrode and the semiconductor region or between the substrate and the second electrically conductive electrode forming a junction of a Schottky diode, the transient voltage suppression diode and the Schottky diode being coupled between the first and the second electrically conductive electrodes in anti-series configuration.

13. The electronic circuit according to claim 12, further comprising at least four bridge-connected electronic components, and four transient voltage suppression devices, each transient voltage suppression device being arranged in parallel with a respective one of the bridge-connected electronic components.

14. The electronic circuit according to claim 12, wherein the second interface is located between the first electrically conductive electrode and the semiconductor region, and wherein a dopant concentration of the second conductivity type of the semiconductor region is between $1 \cdot 10^{16}$ at/cm$^3$ and $1 \cdot 10^{17}$ at/cm$^3$.

15. The electronic circuit according to claim 12, wherein the second interface is located between the substrate and the second electrically conductive electrode, and wherein a dopant concentration of the second conductivity type of the semiconductor region is between $1 \cdot 10^{16}$ at/cm$^3$ and $1 \cdot 10^{20}$ at/cm$^3$.

16. The electronic circuit according to claim 12, wherein the second interface is located between the first electrically conductive electrode and the semiconductor region, and wherein a dopant concentration of the first conductivity type of the substrate at the first interface is between $2 \cdot 10^{14}$ at/cm$^3$ and $3 \cdot 10^{16}$ at/cm$^3$.

17. The electronic circuit according to claim 12, wherein the second interface is located between the substrate and the second electrically conductive electrode, and wherein a dopant concentration of the first conductivity type of the substrate at the first interface is between $2 \cdot 10^{14}$ at/cm$^3$ and $1 \cdot 10^{17}$ at/cm$^3$.

18. The electronic circuit according to claim 12, wherein the substrate comprises a stack of first and second portions, wherein:
   the first portion contains the semiconductor region;
   the second portion is in contact with the second electrically conductive electrode; and
   a first dopant concentration of the first conductivity type of the first portion is strictly lower than a second dopant concentration of the first conductivity type of the second portion.

19. A transient voltage suppression device comprising:
   a single crystal semiconductor substrate doped with a first conductivity type and comprising first and second surfaces opposing each other;
   a semiconductor region doped with a second conductivity type opposite to the first conductivity type and extending into the substrate from the first surface;
   a first electrically conductive electrode on the first surface contacting the semiconductor region;
   a second electrically conductive electrode on the second surface contacting the substrate;
   a first interface between the substrate and the semiconductor region forming a junction of a transient voltage suppression diode; and
   a second interface between the substrate and the second electrically conductive electrode forming a junction of a Schottky diode, the transient voltage suppression diode and the Schottky diode being coupled between the first and the second electrically conductive electrodes in anti-series configuration.

20. The device according to claim 19, wherein a dopant concentration of the second conductivity type of the semiconductor region is between $1 \cdot 10^{16}$ at/cm$^3$ and $1 \cdot 10^{20}$ at/cm$^3$.

21. The device according to claim 19, wherein a dopant concentration of the first conductivity type of the substrate at the first interface is between $2 \cdot 10^{14}$ at/cm$^3$ and $1 \cdot 10^{17}$ at/cm$^3$.

* * * * *